(12) United States Patent
Pikus et al.

(10) Patent No.: US 10,210,302 B2
(45) Date of Patent: Feb. 19, 2019

(54) ELECTROSTATIC DAMAGE PROTECTION CIRCUITRY VERIFICATION

(71) Applicant: Mentor Graphics Corporation, Wilsonville, OR (US)

(72) Inventors: Fedor G. Pikus, Beaverton, OR (US); Ziyang Lu, Camas, WA (US); Patrick D. Gibson, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/987,737

(22) Filed: Jan. 4, 2016

(65) Prior Publication Data

US 2016/0117437 A1  Apr. 28, 2016

Related U.S. Application Data

(63) Continuation-in-part of application No. 13/426,595, filed on Mar. 21, 2012, now abandoned, which is a continuation of application No. 12/541,906, filed on Aug. 14, 2009, now abandoned.

(60) Provisional application No. 61/089,030, filed on Aug. 14, 2008, provisional application No. 61/089,050, filed on Aug. 14, 2008.

(51) Int. Cl.
*G06F 9/455* (2018.01)
*G06F 17/50* (2006.01)

(52) U.S. Cl.
CPC ............... *G06F 17/5081* (2013.01)

(58) Field of Classification Search
USPC ........................................... 716/112
See application file for complete search history.

(56) References Cited

U.S. PATENT DOCUMENTS

| 6,859,915 | B1 * | 2/2005 | Frank | G06F 17/5018 716/112 |
| 2004/0003356 | A1 * | 1/2004 | Dewey, III | G06F 17/5036 716/115 |
| 2006/0070015 | A1 * | 3/2006 | Iwaki | G06F 17/5036 716/115 |

(Continued)

*Primary Examiner* — Bryce M Aisaka

(57) ABSTRACT

Techniques for efficiently determining whether an interconnect line has an impedance component value below a maximum specified value. A specified maximum impedance component value is used to limit the number of interconnect lines that are analyzed by a parasitic extraction analysis process. An analysis window is created based upon the characteristics of the interconnect lines and the specified maximum impedance component value. The size of the window corresponds to the minimum length of the interconnect line that would have the specified maximum impedance component value. Once the analysis window has been created, the interconnect lines are examined to determine if any of them reaches to or beyond the analysis window, whereby interconnect lines that exceed the specified maximum impedance component value can be identified. If there are any remaining interconnect lines that have not been determined to exceed the specified maximum impedance component value through the use of the analysis window, then the impedance component values of these remaining interconnect lines can be specifically determined using a parasitic extraction process.

20 Claims, 4 Drawing Sheets

(56) References Cited

U.S. PATENT DOCUMENTS

2013/0211759 A1* 8/2013 Broyde ................ G01R 27/28
702/79

* cited by examiner

ELECTROSTATIC DAMAGE PROTECTION CIRCUITRY VERIFICATION

RELATED APPLICATIONS

This application is a continuation in part of U.S. patent application Ser. No. 13/426,595, filed on Mar. 21, 2012, entitled "Electrostatic Damage Protection Circuitry Verification," and naming Fedor G. Pikus et al. as inventors, which application is incorporated entirely herein by reference, and which application in turn was a continuation of U.S. patent application Ser. No. 12/541,906, filed on Aug. 14, 2009, entitled "Electrostatic Damage Protection Circuitry Verification," and naming Fedor G. Pikus et al. as inventors, which application is incorporated entirely herein by reference, and which application in turn claimed priority under 35 U.S.C. § 119 to (1) U.S. Provisional Patent Application No. 61/089,030, filed on Aug. 14, 2008, entitled "Electrostatic Damage Protection Circuitry Verification," and naming Hazem Hegazy et al. as inventors, each of which application is incorporated entirely herein by reference, and to (2) U.S. Provisional Patent Application No. 61/089,050, filed on Aug. 14, 2008, entitled "Electrostatic Damage Protection Circuitry Verification," and naming Fedor G. Pikus as inventor, which application is incorporated entirely herein by reference as well.

FIELD OF THE INVENTION

The present invention is directed to the verification of electrostatic damage protection circuitry verification in an integrated circuit design. Various implementations of the invention may be useful for verifying that one or more impedance components associated with an electrostatic damage protection circuit is below a minimum value.

BACKGROUND OF THE INVENTION

Many microdevices, such as integrated circuits, have become so complex that these devices cannot be manually designed. For example, even a simple microprocessor may have millions and millions of transistors that cooperate to form the components of the microprocessor. As a result, electronic design automation tools have been created to assist circuit designers in designing a circuit, and then analyzing the circuit design before it is manufactured.

Designing and fabricating microcircuit devices involve many steps during a 'design flow' process. These steps are highly dependent on the type of microcircuit, its complexity, the design team, and the fabricator or foundry that will manufacture the microcircuit from the design. Several steps are common to most design flows, however. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

After the logical design is deemed satisfactory, it is converted into physical design data by synthesis software. This physical design data or "layout" design data will include geometric elements representing the image that will be written onto a mask used to fabricate the desired microcircuit device in a photolithographic process at a foundry. While these geometric elements may be of any shape, with conventional mask or reticle writing tools the geometric elements typically will be polygons or line edges used to form polygons. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) verification process.

Once the correctness of the logical design has been verified, and geometric data corresponding to the logical design has been created in a layout design, the geometric data then may be analyzed. For example, because the physical design data is employed to create masks used at a foundry, the data must conform to the foundry's requirements. Each foundry specifies its own physical design parameters for compliance with their processes, equipment, and techniques. Accordingly, the design flow may include a process to verify that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, etc. Examples of electronic design automation "verification" tools that perform these types of electronic design automation verification processes include the Calibre family of software tools available from Mentor Graphics Corporation of Wilsonville, Oreg.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, or rectangles or other trapezoids. Moreover, the sizes of the polygons are limited physically by the maximum beam (or beam array) size available to the tool. Accordingly, the larger polygons in a physical layout design data will typically be "fractured" into the smaller, more basic polygons that can be written by the mask or reticle writing tool.

One process that is desirable for analyzing integrated circuit designs is the ability to verify the presence of appropriate electrostatic damage protection circuitry. Electrostatic damage protection circuitry protects functional circuit from sudden spikes of electrostatic power. In addition to confirming that the integrated circuit includes the desired circuit components (e.g., one or more electrostatic damage protection diodes), it is also useful to confirm that the interconnection lines connecting those circuit components do not exceed one or more maximum impedance components. For example, it would be useful to confirm that the total resistance from an input/output pad, through an electrostatic damage protection circuit, to the location on the ground plane layer where the functional circuit is grounded does not exceed the total resistance from the from an input/output pad through the functional circuit to the ground plane layer. If it does, then an electrostatic discharge will circumvent the electrostatic damage protection circuit, and potentially damage the functional circuit.

Ideally, the resistance of the interconnect lines connecting the electrostatic damage protection circuit components can be determined from the thickness and distance of the interconnect lines. As a practical matter, however, the interconnect lines may have long paths and vary in width along their lengths, making their resistance difficult to determine. Further, the interconnect lines could be connected to other components along their length, such as transistor contacts, which also may impact the value of their impedance components.

While some electronic design automation tools can perform a parasitic extraction analysis on interconnect lines, in order to determine one or more impedance component values of the lines, the calculations required to perform this extraction process are extremely resource intensive and time consuming. Typically, the parasitic extraction analysis process would transform each interconnect being analyzed in the design into a resistor, such that each contact with an interconnect line and each turn of an interconnect line is treated as a separate resistor, capacitor and/or inductor, depending upon the impedance component being calculated. Each ground plane of the design, which is conventionally formed by a grid of interconnect lines, would then become a huge network of resistors, capacitors and/or inductors. In order to determine if the interconnect lines associated with an electrostatic damage protection circuit had less than a maximum specified impedance component value, the analysis process would then walk through the resistor, capacitor and/or inductance network representing the entire circuit design to identify all possible connections to the electrostatic damage protection circuit and their associated parasitic values

BRIEF SUMMARY OF THE INVENTION

Aspects of the invention relate to techniques for efficiently determining whether an interconnect line has an impedance component value below a maximum specified value. While various embodiments of the invention may be used to efficiently analyze any interconnect line, these embodiments can be particularly usefully in determining whether interconnect lines connecting an electrostatic damage protection circuit to an input/output pad or to a ground plane have an impedance component value, such as a resistance value, a capacitance value, or an inductance value, below a maximum specified value.

According to various implementations of the invention, the specified maximum impedance component value is used to limit the number of interconnect lines that are analyzed by a parasitic extraction analysis process. More particularly, an analysis window is created based upon the characteristics of the interconnect lines and the specified maximum impedance component value. The size of the window corresponds to the minimum length of the interconnect line that would have the specified maximum impedance component value. For example, if the specified maximum impedance component value is a resistance of 5 ohms, and the interconnect line has a typical resistance of 0.5 ohms/microns, then the analysis window could be a circular window with a radius of 10 microns. If the analysis is examining the interconnect lines from, e.g., an input/output pad to an electrostatic damage protection circuit component, then the analysis window could be centered on the input/output pad or the input contact of the electrostatic damage protection circuit component. Similarly, if the analysis is examining the interconnect lines from the electrostatic damage protection circuit component to the ground plane, then the analysis window could be centered on the output contact of the electrostatic damage protection circuit component or the connection point to the ground plane, whereas if the analysis is examining the interconnect lines from the ground plane to a functional circuit component, then the analysis window could be centered on the connection point of the ground plane or the contact of the functional circuit component.

Once the analysis window has been created, the interconnect lines are examined to determine if any of them reaches to (or beyond) the analysis window. If, for example, the specified maximum impedance component value is a resistance value, it can be determined that all of the interconnect lines that extend to or beyond the perimeter of the analysis window exceed the maximum resistance value, and need not be considered further. Similarly, if the specified maximum impedance component value is a capacitance value, it can be determined that all of the interconnect lines that do not extend to or beyond the perimeter of the analysis window exceed the maximum capacitance value and need not be considered further.

If there are any remaining interconnect lines that have not been determined to exceed the specified maximum impedance component value through the use of the analysis window, then the impedance component values of these remaining interconnect lines can be specifically determined using a parasitic extraction process. Because the use of the analysis window has eliminated inapplicable interconnect lines, however, the number of interconnect lines to be further analyzed will typically be reduced and can be more efficiently analyzed by the parasitic extraction analysis process.

DETAILED DESCRIPTION OF THE INVENTION

Operating Environment

As will be discussed in more detail below, various embodiments of the invention relate to analog design-rule-check tools for creating and implementing models for various electronic design automation verification processes. With some examples of the invention, an analog design-rule-check tool can be incorporated into a larger electronic design automation verification tool. For still other examples of the invention, an analog design-rule-check tool can be configured as a separate, stand-alone tool. With both arrangements, however, an analog design-rule-check tool according to various embodiments of the invention may be implemented using computer-executable software instructions executable or executed by one or more programmable computing devices.

Because various embodiments of the invention may be implemented using software instructions, the components and operation of a generic programmable computer system on which various embodiments of the invention may be employed will first be described. Due to the complexity of some electronic design automation processes and the large size of many circuit designs, various electronic design automation are configured to operate on a computing system capable of simultaneously running multiple processing threads. Accordingly, the components and operation of a computer network having a host or master computer and one or more remote or servant computers therefore will be described in particular with reference to FIG. 1. This operating environment is only one example of a suitable operating environment, however, and is not intended to suggest any limitation as to the scope of use or functionality of the invention.

Figure 1:
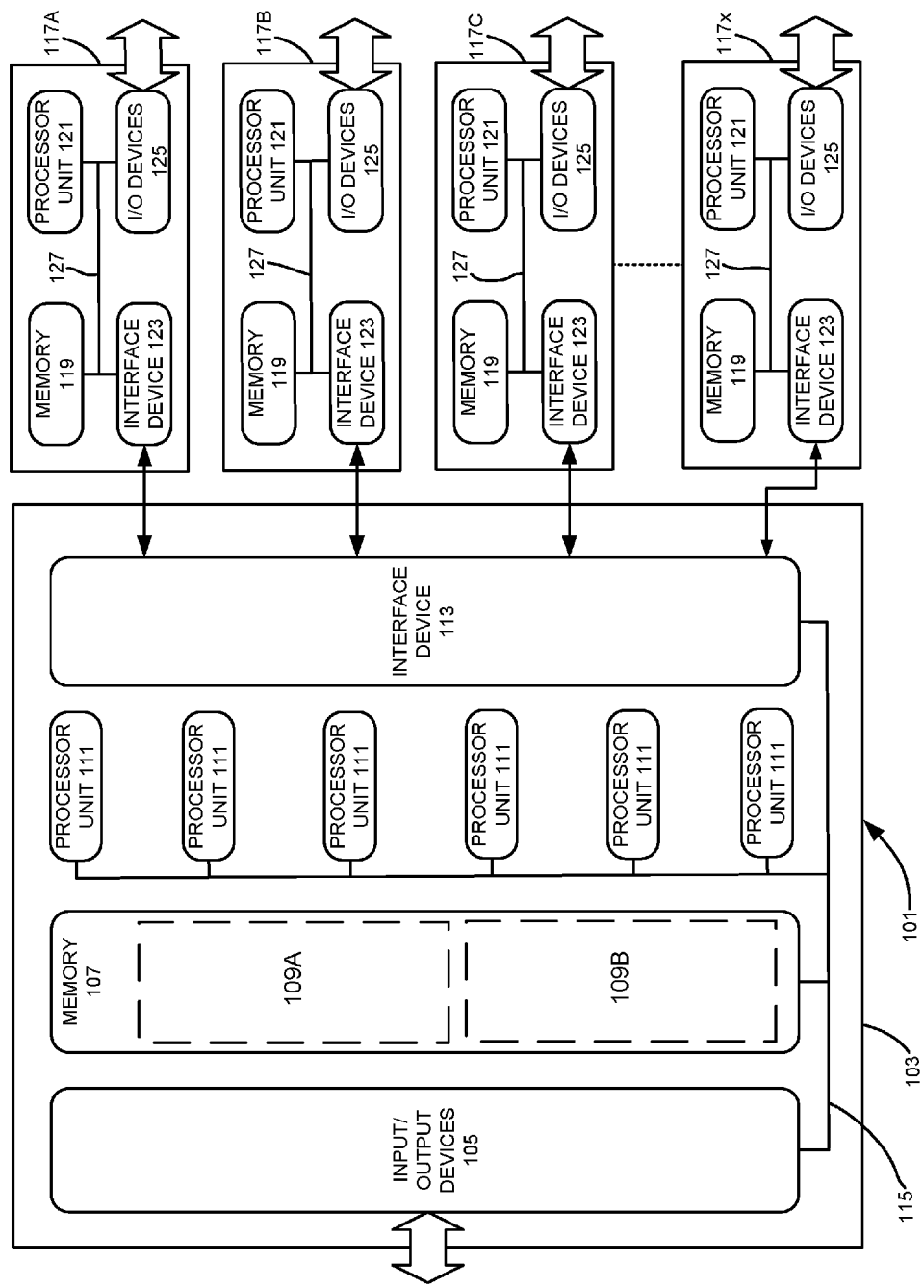
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
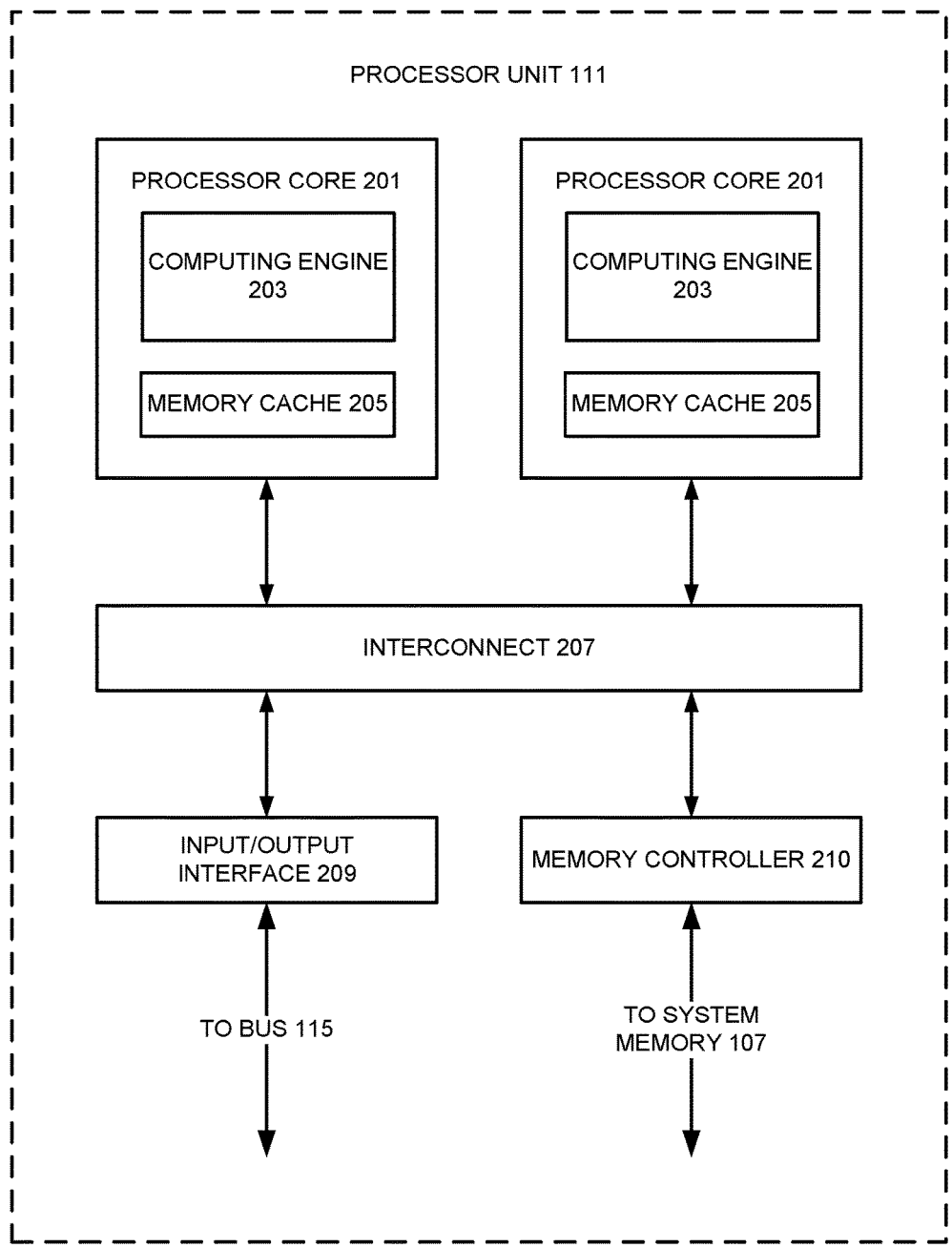
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having a single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer system illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify layout design data for manufacturing a microdevice, such as a microcircuit. As used herein, the terms "design" and "design data" are intended to encompass layout design data describing an entire microdevice, such as an integrated circuit device or micro-electromechanical system (MEMS) device. These terms also are intended to encompass a smaller set of layout design data describing one or more components of an entire microdevice, however, such as a layer of an integrated circuit device, or even a portion of a layer of an integrated circuit device. Still further, the terms "design" and "design data" are intended to encompass data describing more than one microdevice as well, such as data to be used to create a mask or reticle for simultaneously forming multiple microdevices on a single wafer. A layout design will provide geometric elements representing the image that will be written onto a mask used to fabricate the desired microcircuit device in a photolithographic process at a foundry. While these geometric elements may be of any shape, they typically will be whole polygons, line edges used to form polygons, or groups of line edges used to form polygons. With various examples of the invention, these geometric elements can be described using any desired mechanism, such as vertices, vectors, or some combination thereof.

As previously noted, various examples of the invention may be particularly applicable to one or more electronic design automation processes for verifying that the circuit design complies with specified requirements, identifying problems in the design, modifying the circuit design to improve its manufacturability, or some combination thereof. To facilitate an understanding of various embodiments of the invention, one family of tools for automatic design automation, directed to the analysis and modification of a design for an integrated circuit, will now be generally described.

Figure 3:
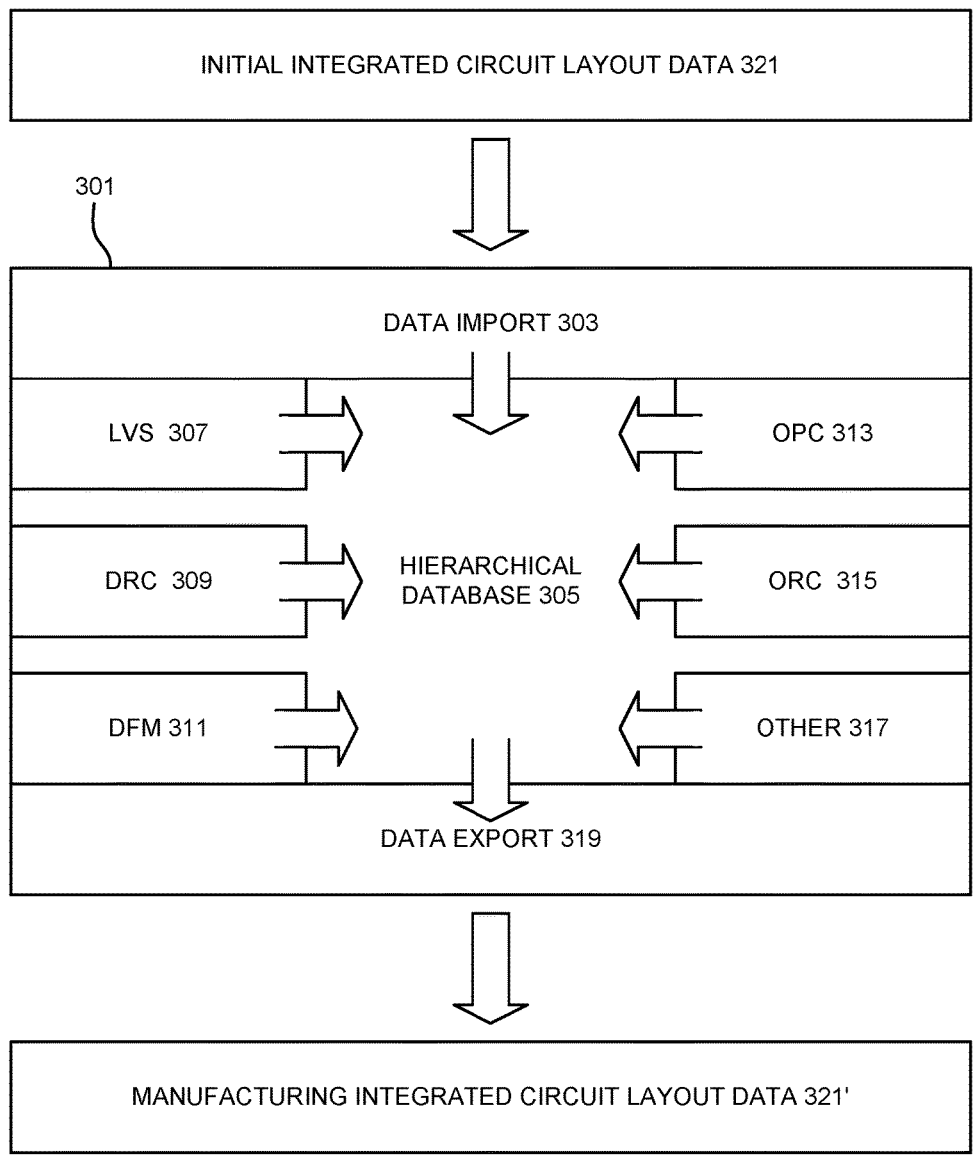
FIG. 3 schematically illustrates an example of a family of software tools for automatic design automation that may be employed with various embodiments of the invention.

Turning now to FIG. 3, an analysis system 301, which may be implemented by a variety of different software application tools, includes a data import module 303 and a hierarchical database 305. The analysis system 301 also includes a layout-versus-schematic (LVS) verification module 307, a design rule check (DRC) module 309, a design-for-manufacturing (DFM) module 311, an optical proximity correction (OPC) module 313, and an optical proximity rule check (ORC) module 315. The analysis system 301 may further include other modules 317 for performing additional functions as desired, such as a phase shift mask (PSM) module (not shown), an etch simulation analysis module (not shown) and/or a planarization simulation analysis module (not shown). The system 301 also has a data export module 319. One example of tools that may be employed for such an analysis system is the Calibre® family of software tools available from Mentor Graphics® Corporation of Wilsonville, Oreg.

Initially, the system 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics® Corporation. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line to the contact electrode. The initial integrated circuit layout data 321 may be converted by the data import module 303 into a format that can be more efficiently processed by the remaining components of the system 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. The layout data 321 may be manually revised by a user, automatically revised by the layout-versus-schematic module 307, or some combination thereof.

Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, the layout data 321 may be manually modified by a user, automatically modified by the design rule check module 309, or some combination thereof.

The modified layout data 321 is then processed by the design for manufacturing module 311. As previously noted, a "design-for-manufacture" process attempts to identify elements in a design representing structures with a significant likelihood of being improperly formed during the manufacturing process. A "design-for-manufacture" process may additionally determine what impact that likelihood of the improper formation of the identified structures will have on the yield of devices manufactured from the circuit design, and/or modifications that will reduce the likelihood that the identified structures will be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

It should be noted that, in addition to the term "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules 317 may be employed to perform alternate or additional manipulations of the layout data 321, as desired. For example, some implementations of the tool 301 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The system 301 also may alternately or additionally employ, for example, an etch simulation analysis process or a planarization simulation analysis process. The process or processes performed by each of these additional modules 317 may also lead to the creation of a new version of the layout data 321 that includes revisions.

After all of the desired operations have been performed on the initial layout data 321, the data export module 319 converts the processed layout data 321 into a desired data format. For example, the data export module 319 (or another intermediate data conversion device) may output the processed layout data 321 as manufacturing integrated circuit layout data 323 that can be used to form one or more masks or reticules to manufacture the integrated circuit.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout, Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process. Examples of electronic design tools that employ one or more of the logical analysis processes, geometry analysis processes or simulation analysis processes discussed above are described in U.S. Pat. No. 6,230,299 to McSherry et al., issued May 8, 2001, U.S. Pat. No. 6,249,903 to McSherry et al., issued Jun. 19, 2001, U.S. Pat. No. 6,339,836 to Eisenhofer et al., issued Jan. 15, 2002, U.S. Pat. No. 6,397,372 to Bozkus et al., issued May 28, 2002, U.S. Pat. No. 6,415,421 to Anderson et al., issued Jul. 2, 2002, and U.S. Pat. No. 6,425,113 to Anderson et al., issued Jul. 23, 2002, each of which are incorporated entirely herein by reference.

Verification of Impedance Component Values

Figure 4:
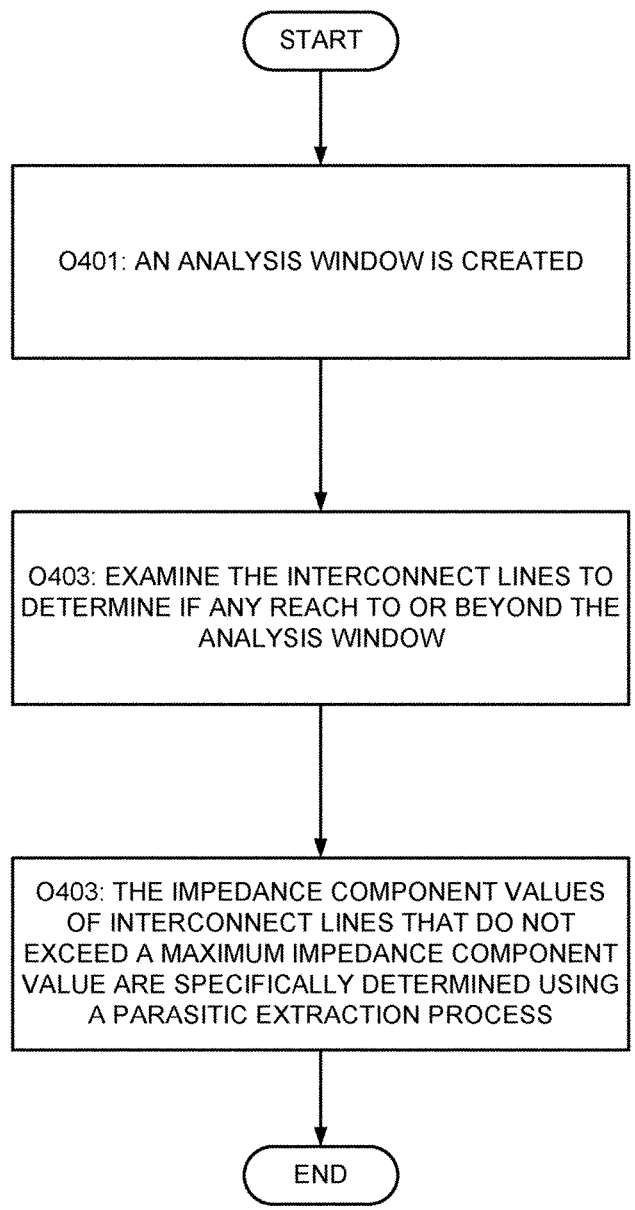
FIG. 4 illustrates a flowchart showing an operation for limiting the number of interconnect lines that are analyzed by a parasitic extraction analysis process by verifying impedance component values.

According to various implementations of the invention, the specified maximum impedance component value is used to limit the number of interconnect lines that are analyzed by a parasitic extraction analysis process. More particularly, as shown in FIG. 4, in operation 401 an analysis window is created based upon the characteristics of the interconnect lines and the specified maximum impedance component value. The size of the window corresponds to the minimum length of the interconnect line that would have the specified maximum impedance component value. For example, if the specified maximum impedance component value is a resistance of 5 ohms, and the interconnect line has a typical resistance of 0.5 ohms/microns, then the analysis window could be a circular window with a radius of 10 microns. If the analysis is examining the interconnect lines from, e.g., an input/output pad to an electrostatic damage protection circuit component, then the analysis window could be centered on the input/output pad or the input contact of the electrostatic damage protection circuit component. Similarly, if the analysis is examining the interconnect lines from the electrostatic damage protection circuit component to the ground plane, then the analysis window could be centered on the output contact of the electrostatic damage protection circuit component or the connection point to the ground plane, whereas if the analysis is examining the interconnect lines from the ground plane to a functional circuit component, then the analysis window could be centered on the connection point of the ground plane or the contact of the functional circuit component.

Once the analysis window has been created, in operation O403 the interconnect lines are examined to determine if any of them reaches to (or beyond) the analysis window. If, for example, the specified maximum impedance component value is a resistance value, it can be determined that all of the interconnect lines that extend to or beyond the perimeter of the analysis window exceed the maximum resistance value, and need not be considered further. Similarly, if the specified maximum impedance component value is a capacitance value, it can be determined that all of the interconnect lines that do not extend to or beyond the perimeter of the analysis window exceed the maximum capacitance value and need not be considered further.

If there are any remaining interconnect lines that have not been determined to exceed the specified maximum impedance component value through the use of the analysis window, then in operation O405 the impedance component values of these remaining interconnect lines can be specifically determined using a parasitic extraction process. Because the use of the analysis window has eliminated inapplicable interconnect lines, however, the number of interconnect lines to be further analyzed will typically be reduced and can be more efficiently analyzed by the parasitic extraction analysis process.

It should be appreciated that, if the specified maximum impedance component value is a maximum resistance, in some instances an interconnect line may still exceed the specified maximum impedance component value even if it does not reach or go beyond the analysis window. For example, an interconnect line may turn within the window, so that its total length causes it to exceed the maximum resistance value even if both of its endpoints are within the analysis window.

With various embodiments of the invention, the area of the analysis window will depend upon number of interconnect line paths that may be combined in determining whether they exceed the specified maximum impedance component value. For example, the interconnect line may have a typical resistance of 0.5 ohms/microns, and a designer may specify that a total resistance between an input/output pad and an input contact of an electrostatic damage protection circuit component may not exceed 5 ohms. If the designer further specifies that only one interconnect line path will be used for this connection, then the analysis window will be 10 microns. If, however, the designer specifies that two parallel interconnect line paths may be used, then the analysis window will be 20 microns (since each interconnect path may have a total resistance of 10 ohms before their combined parallel resistance exceeds 5 ohms).

Further, various examples of the invention may create an analysis window for the ground plane grid by treating the ground plane grid as a continuous medium. For example, when considering a maximum resistance value, the analysis would determine the distance between the electrostatic damage protection circuit component contact point and the contact of the function circuit. If distance is too far, the analysis window will indicate that the resistance is too high.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A computer-implemented method of identifying interconnect lines represented in a circuit design that exceed a maximum impedance component value, comprising:
creating an analysis window for the circuit design based upon characteristics of the interconnect lines and the maximum impedance component value;
identifying interconnect lines that extend from a center of the analysis window to or beyond a perimeter of the analysis window;
based upon identified interconnect lines, determining which interconnect lines within the analysis window have an impedance component value that must exceed the maximum impedance component value and which interconnect lines have an impedance component value that may exceed the maximum impedance component value; and
determining the specific impedance component value for the interconnect lines having an impedance component value that may exceed the maximum impedance component value.

2. The method recited in claim 1, further comprising determining the specific impedance component value for the interconnect lines having an impedance component value that may exceed the maximum impedance component value using a computer-implemented parasitic extraction process.

3. The method recited in claim 1, wherein
the maximum impedance component value is a resistance value, and
the interconnect lines that extend to or beyond the perimeter of the analysis window are determined to exceed the maximum impedance component value.

4. The method recited in claim 1, wherein
the maximum impedance component value is a capacitance value, and
the interconnect lines that do not extend to or beyond the perimeter of the analysis window are determined to exceed the maximum impedance component value.

5. The method recited in claim 1, wherein the center of the analysis window is on the input/output pad or input contact of an electrostatic damage protection circuit component.

6. The method recited in claim 1, wherein the center of the analysis window is on an output contact of an electrostatic damage protection circuit component.

7. The method recited in claim 1, wherein the center of the analysis window is on a connection point of an electrostatic damage protection circuit component to a ground plane.

8. The method recited in claim 1, wherein the center of the analysis window is on a connection point of a functional circuit component to a ground plane.

9. The method recited in claim 1, wherein the center of the analysis window is on a connection point of a functional circuit component.

10. The method recited in claim 1, wherein an area of the analysis window is determined by a number of interconnect line paths that may be combined to determine the maximum impedance component value.

11. A non-transitory computer-readable medium comprising instructions that, when executed by a processor, cause a system to:
create an analysis window for a circuit design based upon characteristics of interconnect lines and a maximum impedance component value;
identify interconnect lines that extend from a center of the analysis window to or beyond a perimeter of the analysis window;
based upon identified interconnect lines, determine which interconnect lines within the analysis window have an impedance component value that must exceed the maximum impedance component value and which interconnect lines have an impedance component value that may exceed the maximum impedance component value; and
determine the specific impedance component value for the interconnect lines having an impedance component value that may exceed the maximum impedance component value.

12. The non-transitory computer-readable medium recited in claim 11, further comprising instructions that, when executed by the processor, cause the system to determine the specific impedance component value for the interconnect lines having an impedance component value that may exceed the maximum impedance component value using a computer-implemented parasitic extraction process.

13. The non-transitory computer-readable medium recited in claim 11, wherein
the maximum impedance component value is a resistance value, and the interconnect lines that extend to or beyond the perimeter of the analysis window are determined to exceed the maximum impedance component value.

14. The non-transitory computer-readable medium recited in claim 11, wherein
the maximum impedance component value is a capacitance value, and
the interconnect lines that do not extend to or beyond the perimeter of the analysis window are determined to exceed the maximum impedance component value.

15. The non-transitory computer-readable medium recited in claim 11, wherein the center of the analysis window is on the input/output pad or input contact of an electrostatic damage protection circuit component.

16. The non-transitory computer-readable medium recited in claim 11, wherein the center of the analysis window is on an output contact of an electrostatic damage protection circuit component.

17. The non-transitory computer-readable medium recited in claim 11, wherein the center of the analysis window is on a connection point of an electrostatic damage protection circuit component to a ground plane.

18. The non-transitory computer-readable medium recited in claim 11, wherein the center of the analysis window is on a connection point of a functional circuit component to a ground plane.

19. The non-transitory computer-readable medium recited in claim 11, wherein the center of the analysis window is on a connection point of a functional circuit component.

20. The non-transitory computer-readable medium recited in claim 11, wherein an area of the analysis window is determined by a number of interconnect line paths that may be combined to determine the maximum impedance component value.

* * * * *